US006408424B1

(12) United States Patent
Mukherjee et al.

(10) Patent No.: US 6,408,424 B1
(45) Date of Patent: Jun. 18, 2002

(54) VERIFICATION OF SEQUENTIAL CIRCUITS WITH SAME STATE ENCODING

(75) Inventors: Rajarshi Mukherjee, Sunnyvale; Jawahar Jain; Vamsi Boppana, both of Santa Clara, all of CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/325,886

(22) Filed: Jun. 4, 1999

(51) Int. Cl.$^7$ .............................................. G06F 17/50

(52) U.S. Cl. ............................................... 716/5; 716/4

(58) Field of Search .................... 716/5, 4, 7

(56) References Cited

U.S. PATENT DOCUMENTS

| | | | | | |
|---|---|---|---|---|---|
| 5,230,001 A | * | 7/1993 | Chandra et al. | ............... | 371/27 |
| 5,257,268 A | * | 10/1993 | Agrawal et al. | ............... | 371/27 |
| 5,677,915 A | * | 10/1997 | Whetsel | ..................... | 371/22.3 |
| 5,949,691 A | * | 9/1999 | Kurosaka et al. | ........... | 364/489 |
| 6,188,934 B1 | * | 2/2001 | Emura | ......................... | 700/110 |
| 6,212,669 B1 | * | 4/2001 | Jain | ............................... | 716/7 |

OTHER PUBLICATIONS

Hoskote et al, "Automatic Verification of Implementations of Large Circuits Against HDL Specificatoins," IEEE, Mar. 1997, pp. 217–228.*
Corno et al, "Approximate Equivalence Verification of Sequential Circuits Via Genetic Algorithms," IEEE, Mar. 1999, pp. 754–755.*
Corno et al, "Vega: A Verification Tool Based on Genetic Algorithms," IEEE, Oct. 1998, pp. 321–326.*
Huang et al, "Aquila: An Equivalence Verifier for Large Sequential Circuits," IEEE, Jan. 1997, pp. 455–460.*
Mohnke et al, "Establishing Latch Correspondence for Sequential Circuits Using Distinguishing Signatures," IEEE, Aug. 1997, pp. 472–476.*
Huang et al, "An ATPG–Based Framework for Verifying Sequential Equivalence," IEEE, Oct. 1996, pp. 865–874.*
Masahiro Fujita, "Methods for Automatic Design Error Correction in Sequential Circuits," IEEE, 1993, pp. 76–80.*
Alan J. Hu, "Formal Hardware Verification with BDDs: An Introduction," IEEE, Aug. 1997, pp. 677–682.*
O. Coudert et al., "Verification of Sequential Machines using Boolean Functional Vectors", *Formal VLSI Correctness Verification, Elsevier Science Publishers*, B.V. (North Holland), 1990, pp. 179–196.
O. Coudert et al., "Verfication of Synchronous Sequential Machines based on Symbolic Execution", *Proc. of Intl. Workshop on Automatic Verification Methods for Finite State Systems*, vol. 407 of LNCS, Jun. 1989, pp. 365–373.
J. Burch et al., "Sequential Circuit Verification Using Symbolic Model Checking", *Proc. $27^{th}$ ACM/IEEE DAC*, Paper 3.2, 1990, pp. 46–51.

(List continued on next page.)

*Primary Examiner*—Vuthe Siek
(74) *Attorney, Agent, or Firm*—Christie, Parker & Hale, LLP

(57) ABSTRACT

A system and method for verifying sequential circuits. A single pair of storage elements is selected from a single sequential circuit using the selected pairs of storage elements. A distinguishing sequence of test vectors is computed. Using the computed distinguishing sequence of test vectors, the other storage elements of the sequential circuits are distinguished. Based on the storage elements distinguished in the circuits, a correspondence between the storage elements of the circuits is determined and thus, equivalences between the circuits is found using combinational equivalence checking and the sequential circuit is verified. Alternatively, by using Boolean decision diagrams, the storage elements in the sequential circuit are distinguished and likewise distinguishing groups of storage elements are created. These distinguishing groups are further refined by building new Boolean decision diagrams until no new groupings are created and correspondence between the storage elements of the circuits is determined.

40 Claims, 10 Drawing Sheets

OTHER PUBLICATIONS

S. Huang et al., "AQILA: An Equivalence Verifier for Large Sequential Circuits", *Proc. of Asia–South Pacific DAC*, Jan. 1997, pp. 455–460.

Y. Matsunaga, "An Efficient Equivalence Checker for Combinational Circuits", *Proc. 33${}^{rd}$ ACM/IEEE DAC*, 1996, pp. 629–634.

J. Moondanos et al., "Sequential Redundancy Identification Using Verification Techniques", *Proc. ITC*, Paper 7.3, 1992, pp. 197–205.

R. Mukherjee et al., "FLOVER: Filtering Oriented Combinational Verification Approach", *Proc. IWLS*, 1995.

H. Touati et al,, Implicit State Enumeration of Finite State Machines Using BDDs, *Proc. ICCAD*, 1990, pp. 130–133.

* cited by examiner

VERIFICATION OF SEQUENTIAL CIRCUITS WITH SAME STATE ENCODING

BACKGROUND OF THE INVENTION

The present invention relates generally to the field of Computer-aided design (CAD) systems and methods, and more particularly to CAD systems and methods for digital circuit verification of sequential circuits.

Computer-aided design of digital circuits and other complex digital systems is widely prevalent. The requirements of the circuit or system are defined in an abstract model of the circuit or system. The abstract model is then successively transformed into a number of intermediate stages.

The design of the circuit or system therefore proceeds from the general requirements level to the lower detailed level of the physical design. Interposed between are a number of intermediate levels. These intermediate stages often include a register transfer level model which represents a block structure behavioral design, and a structural model which is a logic level description of the system. Each successive level of the design is tested or verified to ensure that the circuit or system continues to meet the designed specifications.

These circuits or systems may be divided, among other ways, into combinational circuits and sequential circuits. The outputs of a combinational circuit depend entirely on the value of the inputs to the circuit. Thus, the outputs of a combinational circuit do not depend on the values of previous inputs applied to the circuit. The outputs of sequential circuits, however, depend on past values of the inputs with the outputs dependent on the inputs to the circuit and previously generated values of the outputs or some node within the circuit. Thus, a sequential circuit may be viewed as a plurality of combinational logic elements with some of the outputs of the plurality of combinational logic fed back to some of the inputs of the combinational logic via storage elements.

An example of combinational logic is a series of interconnected AND gates in which none of the outputs of the AND gates are fed back to previous AND gates. An example of a storage element is a clocked flip-flop. Other examples of a storage element are latches, registers, and other similar types of storage devices. Initially storage elements have unknown values and need to be forced to specific known states. These known states depend on the inputs to the circuit, i.e., the primary inputs, and the present state of the storage elements. Thus, a sequential circuit may generate different output values for the same set of input vectors depending on the boolean values of the storage elements. Therefore, design verification of a sequential circuit is often complex.

Conventionally, design verification is accomplished by simulating the circuit or system. This is done by stimulating the circuit with a set of test vectors, which represent a set of appropriately chosen inputs to the circuit, and thereafter examining the outputs of the circuit. However, for many circuits that are large and complicated, extensive simulation of the circuit is impractical. Hence, other techniques for verifying sequential circuits have also been developed, such as a Boolean Decision Diagram (BDD) based state space traversal technique, and automatic test pattern generator (ATPG) based traversal technique.

The BDD based state traversal technique however, often requires space, i.e., memory space, which is exponential in the number of primary inputs to the circuit or system. Therefore, for many large circuits memory explosion is a problem. Similarly, the ATPG based traversal technique is inefficient if the circuit is too large.

However, the verification of sequential circuits may be simplified by determining correspondences between storage elements of the two circuits. If such correspondence can be determined the verification step is simplified to a verification step for combinational circuits. Therefore, especially for large circuits, determining the correspondence between the storage elements of the circuits is desirable. Conventional techniques to determine the correspondence between the storage elements, however, are often ineffective. Therefore, the ability to determine the correspondence between the storage elements of multiple circuits quickly and effectively has become increasingly important, especially for large and complicated circuits.

SUMMARY OF THE INVENTION

The present invention provides a method and a system of verifying two sequential circuits, a first sequential circuit and a second sequential circuit. In one embodiment, the method comprises determining storage elements of the first and second sequential circuit, selecting pairs of storage elements of the first sequential circuit, establishing distinguishing criteria from the selected pairs of storage elements of the first sequential circuit and grouping the storage elements of the first and second sequential circuits based on the distinguishing criteria. The distinguishing criteria in one embodiment comprises computing a sequence of test vectors that causes outputs of one storage element in a selected pair of storage elements to differ from outputs of other storage elements.

In another embodiment, a method of verifying a first sequential circuit and a second sequential circuit both having primary inputs and primary outputs is provided. The method comprises grouping storage elements of the first and second sequential circuits, determining next states of the storage elements of the first and second sequential circuits or determining a probabilistic hash code using abstract BDDs or partitioned BDDs or using full ROBDDs without or with hash codes, comparing the hash code or the ROBDD of next state of the storage elements of the first sequential circuits to the next states of the storage elements of the second sequential circuits and regrouping the storage elements of the first and second sequential circuits based on the equivalence of the hash code or ROBDDs of the next states of the first and second sequential circuits. In one form, determining the next states of storage elements includes building sampled Boolean decision diagrams or abstract Boolean decision diagrams to represent the next states of the storage elements.

These and other features of the present invention will be more readily appreciated as the same becomes better understood by reference to the following description when considered in connection with the accompanying drawings.

DETAILED DESCRIPTION OF THE INVENTION

I. OVERVIEW

The present invention provides a method and system for verifying sequential circuits and systems, and particularly for determining a correspondence between storage elements of two sequential circuits. In one embodiment, a state-justification based method distinguishes pairs of storage elements within one sequential circuit using an ATPG tool to find sequences of test vectors that distinguish each pair of storage elements. Using these sequences, the storage elements of another sequential circuit are similarly distinguished.

In another embodiment, a second method uses sampling-based BDDs and abstract BDDs to distinguish the storage elements in the circuit. By building sampling-based BDDs and/or abstract BDDs based on the primary inputs and present state lines of the storage elements, the second method creates groups of equivalent storage elements. Each equivalent group is further refined by building new sampling-based BDDs and/or abstract BDDs until no new groupings are created.

In another embodiment, a third method combines the first and second methods. The third method uses the sampling and abstract BDD based method to create clusters of storage elements. Once no new clusters are created, the state-justification based method, if needed, further refines the clusters. The state-justification based method examines and further distinguishes the storage elements in each group containing more than two storage elements.

In each of the three methods, based on the storage elements distinguished in both circuits, the correspondence between the storage elements of the circuits is determined. The circuit is then verified as a combinational circuit using combinational verification if complete correspondence between storage elements in the two circuits is determined, otherwise as a simplified sequential circuit by sequential verification of the original circuit where the extracted correspondence information is used to simplify verification.

II. State Justification Based Storage Correspondence

A state justification based storage correspondence determines the correspondence between storage elements of two sequential circuits. One sequential circuit represents the circuit to be verified and a second sequential circuit represents a specification circuit. The specification circuit is an error free circuit that has been verified as correct in a previous stage of the design process.

Figure 1:
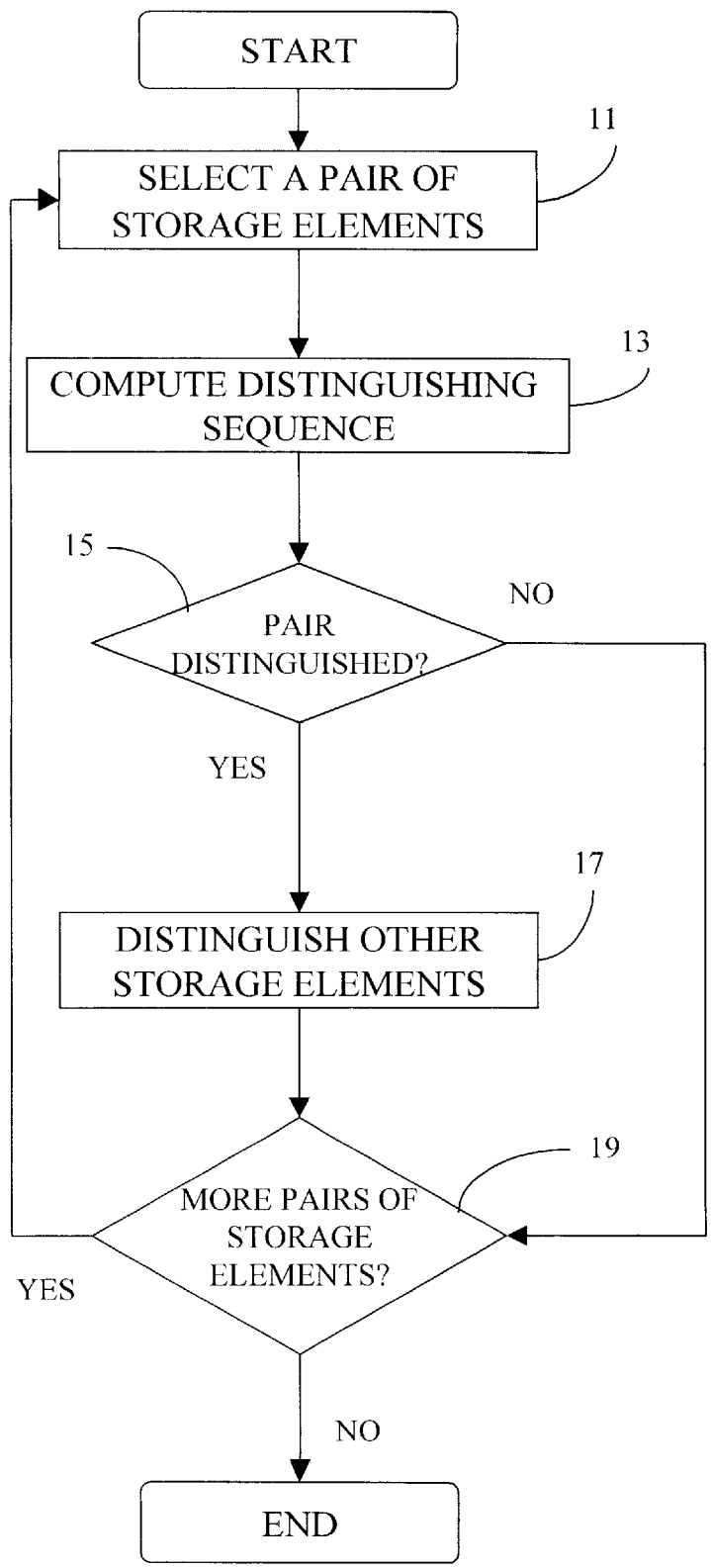
FIG. 1 illustrates a flow diagram of an overview of the state-justification based process.

FIG. 1 illustrates a process of performing a state justification based storage correspondence. In step 11, the process selects a pair of storage elements from the first circuit. In step 13, the process computes a distinguishing sequence of test vectors. A distinguishing sequence is a sequence of test vectors that cause the selected pair of storage elements to output different logic values. A test vector is a set of values applied to the primary inputs of the circuit.

If, in step 15, the process determines that the pair of storage elements are distinguished, then the process uses the distinguishing sequence of test vectors to distinguish further storage elements of the first and second circuit, in step 17. This is accomplished by applying the distinguishing sequence of test vectors in step 17 of the process to the first and second circuits. The output values of the storage elements in the circuits are examined and the storage elements are split into groups or classes, based on their output values. For example, if the outputs of the storage elements are either 0 or 1, the storage elements whose outputs are 0 are placed into a first group and the storage elements whose outputs are 1 are placed into a second group. In step 19, the process determines if additional pairs of storage elements in the first circuit may be distinguished. Additional pairs of storage elements may be distinguished if any group of storage elements contains more than one storage element. If, in step 19, the process determines that no other pairs of storage elements are selectable from the first circuit, then the process ends. However, if, in step 19, the process determines that more pairs of storage elements may be selected, then a different pair of storage elements in the first circuit is selected in step 11 and the process is repeated. In one embodiment, the different pair of storage elements are selected from the same group.

If, in step 15, the process determines that the pair of storage elements are not distinguishable then the process determines, in step 19, if other pairs of storage elements are selectable. Once again, if other pairs of storage elements are not selectable from the first circuit, the process ends. However, if other pairs of storage elements are selectable the process continues repeating steps 11, 13, 15 and 17.

Thus, the storage elements in the two circuits are iteratively divided into further groups until, preferably, each group has only one storage element from the first circuit and only one storage element from the second circuit. As corresponding groups of storage elements are formed using the same sequence of distinguishing test vectors, it is possible to correspond the storage elements in the first circuit with storage elements in the second circuit. Moreover, as distinguishing test sequences are found by applying a test generator to only one of the two circuits and only outputs from two storage elements in only one circuit are examined to determine the distinguishing test sequences, resource expenditure in determining the distinguishing test sequences is reduced.

In another embodiment, the process is modified such that the pairs of storage elements selected include pairs of storage elements selected from only the first circuit and pairs of storage elements selected from only the second circuit. For example, storage elements F1, F2 and F3 are in the first circuit and storage elements S1, S2 and S3 are in the second circuit. The pairs of storage elements selected include the following: F1,F2; F2,F3; F1,F3; S1,S2; S2,S3; S1,S3. Therefore, pairs from both circuits together, such as F1,S2, would not be selected. Hence, step 11 and 19 are modified, in this embodiment, such that pairs of storage elements selected include pairs of storage elements selected from either circuit.

In modified step 11, the process selects a pair of storage elements from either circuit. In modified step 19, the process determines if there are other pairs of storage elements that are selectable from either circuit. If the process determines that additional pairs of storage elements may be selected then the process repeats modified step 11, selecting a different pair of storage elements. However, if the process determines that no more additional pairs of storage elements may be selected, then the process ends. By selecting pairs of storage elements from either circuit, often, optimal sequences of test vectors are determinable given the extended amount of pairs of storage elements able to be selected. However, by selecting pairs of storage elements from ether circuit and not from both circuits at the same time, resource expenditure in determining the distinguishing test sequences is still reduced.

Figure 2:
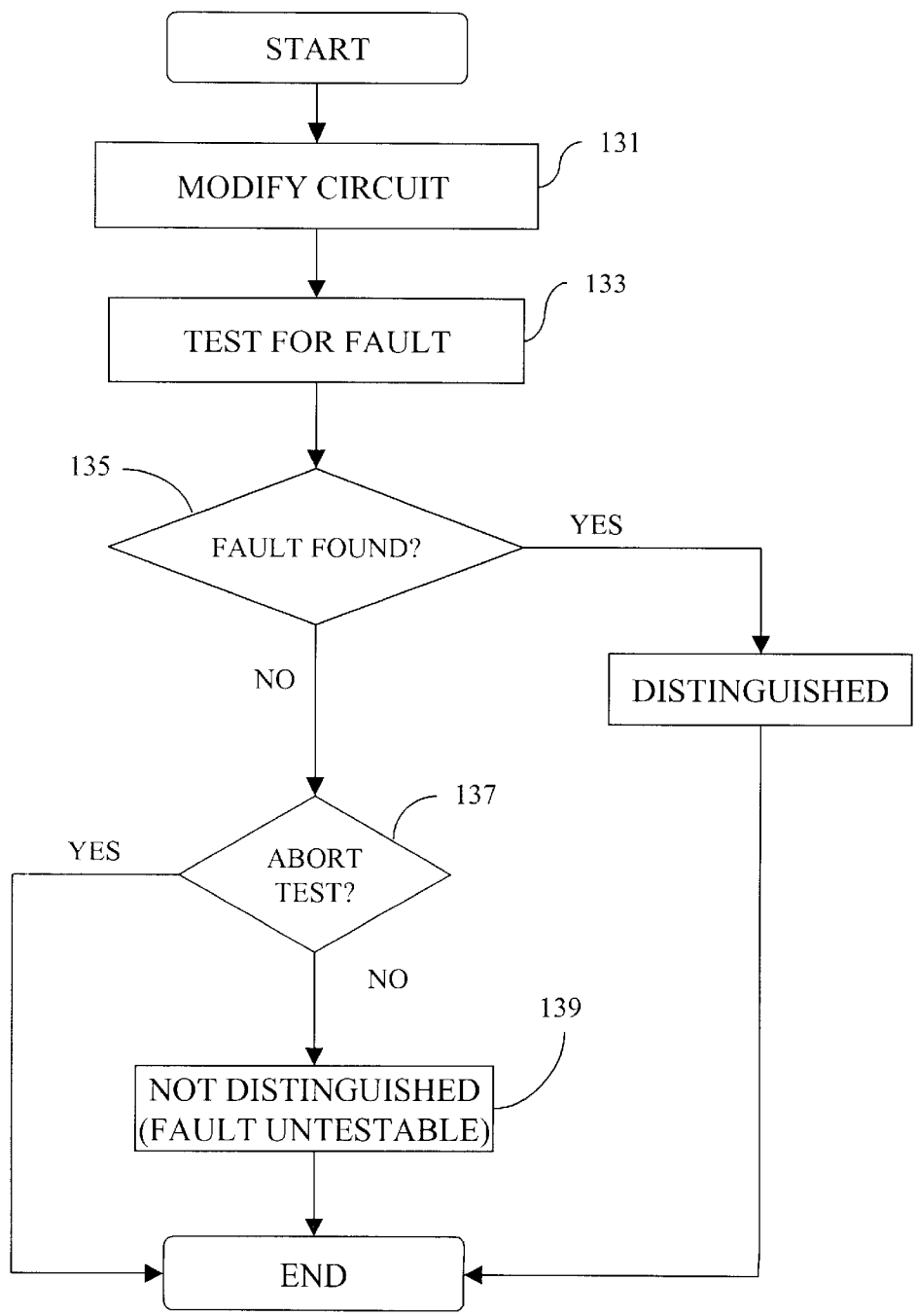
FIG. 2 illustrates a flow diagram of the detailed steps of step 13 of FIG. 1.

FIG. 2 illustrates a process of computing a distinguishing sequence of test vectors. In step 131, the process modifies a sequential circuit to be verified. In one embodiment, the process modifies a netlist of the circuit. The netlist is a representation of the interconnections and gates of the sequential circuit. The netlist is modified to create a XOR gate having as two inputs, the outputs of a pair of storage elements, thereby allowing for testing for a stuck-at-0 fault at the output of the XOR gate. A stuck-at-0 fault at a line is a fault such that the line is stuck or fixed at a logical 0. Testing for a stuck-at-0 fault, methods of which are well-known in the art, at the output of the XOR gate is a convenient way of determining if the storage elements are distinguishable.

Figure 3:
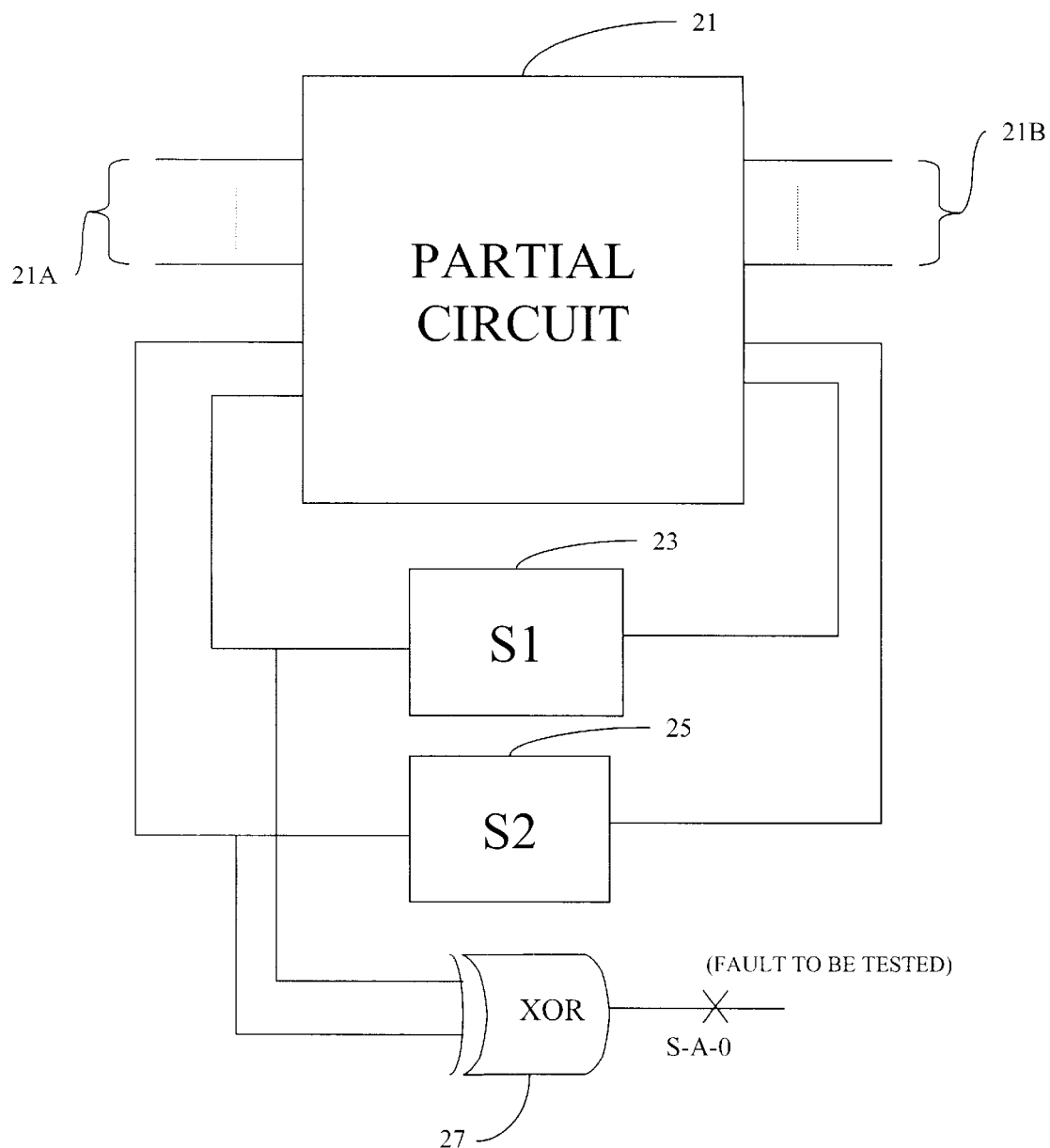
FIG. 3 illustrates an example circuit modified by the state-justification based process.

FIG. 3 illustrates a simplified circuit diagram of an example circuit modified as performed by the process in step 131. The primary inputs 21A supply the inputs to the partial circuit 21. Primary outputs 21B provide outputs for the partial circuit 21. A first storage element 23 and a second storage element 25 represent a pair of storage elements selected by the process in step 11 of FIG. 1. Both storage elements 23 and 25 have inputs connected to the partial circuit and have outputs connected to the partial circuit. The outputs of the storage elements 23 and 25 are also connected to the inputs of the XOR gate 27.

A stuck-at-0 fault is injected at the output of the XOR gate 27. In order, for the XOR gate to output a logical zero, the inputs to the XOR gate 27 must be the same. Hence, the outputs of the storage elements 23 and 25 connected to the XOR gate 27 must also be the same. If the first storage element 23 produces outputs equal to the outputs of the second storage element 25 for all input vectors then the storage elements are indistinguishable.

Referring back to FIG. 2, in step 133, the process tests for the injected fault. In one embodiment, an ATPG tool is used to test for the injected fault. An example of an ATPG tool and its use is discussed in M. Abramovici et al., {D}igital {S}ystem {T}esting and {T}estable {D}esign, Computer Science Press, New York, N.Y., 1990, the disclosure of which is herein incorporated by reference. If, in step 135, the process tests the fault, then the pair of storage elements selected are considered to be distinguished. However, if in step 135, the process does not test the fault, then the process determines if test is to be aborted in step 137. In one embodiment, the process determines that the test is to be aborted if the amount of time for testing has exceeded a predetermined time limit, such as 5 minutes. In another embodiment, the process determines that the test is to be aborted if the ATPG tool has exceeded a predetermined number of iterations of reverse decisions, such as a thousand iterations. In step 137, if the process determines that the test is to be aborted, then the testing for the fault is aborted and the process ends. If the process in step 137 determines that the test is not to be aborted, then the process determines that the fault is untestable, in step 139. If the fault is untestable, then the process considers the pair of storage elements to be indistinguishable.

Referring back to FIG. 3, the conventional ATPG tool, used in one embodiment of the present invention, generates a sequence of test vectors that when applied to the inputs of the circuit produces an output of a logical 1 at the output of the XOR gate 27 in FIG. 3. Also, in one embodiment, the set of test vectors is generated in a random fashion or by using alternative ATPG techniques like those based on genetic algorithms or decision diagrams. If the ATPG tool cannot locate a sequence of test vectors to detect the stuck-at-0 fault, then the storage elements are indistinguishable. However, if the ATPG tool can locate a set of test vectors to detect the stuck-at-0 fault, then the storage elements are distinguishable. Therefore, by creating modifications to a sequential circuit similar to the example in FIG. 3, and testing for the fault injected, the process is able to distinguish some pairs of selected storage elements.

Figure 4:
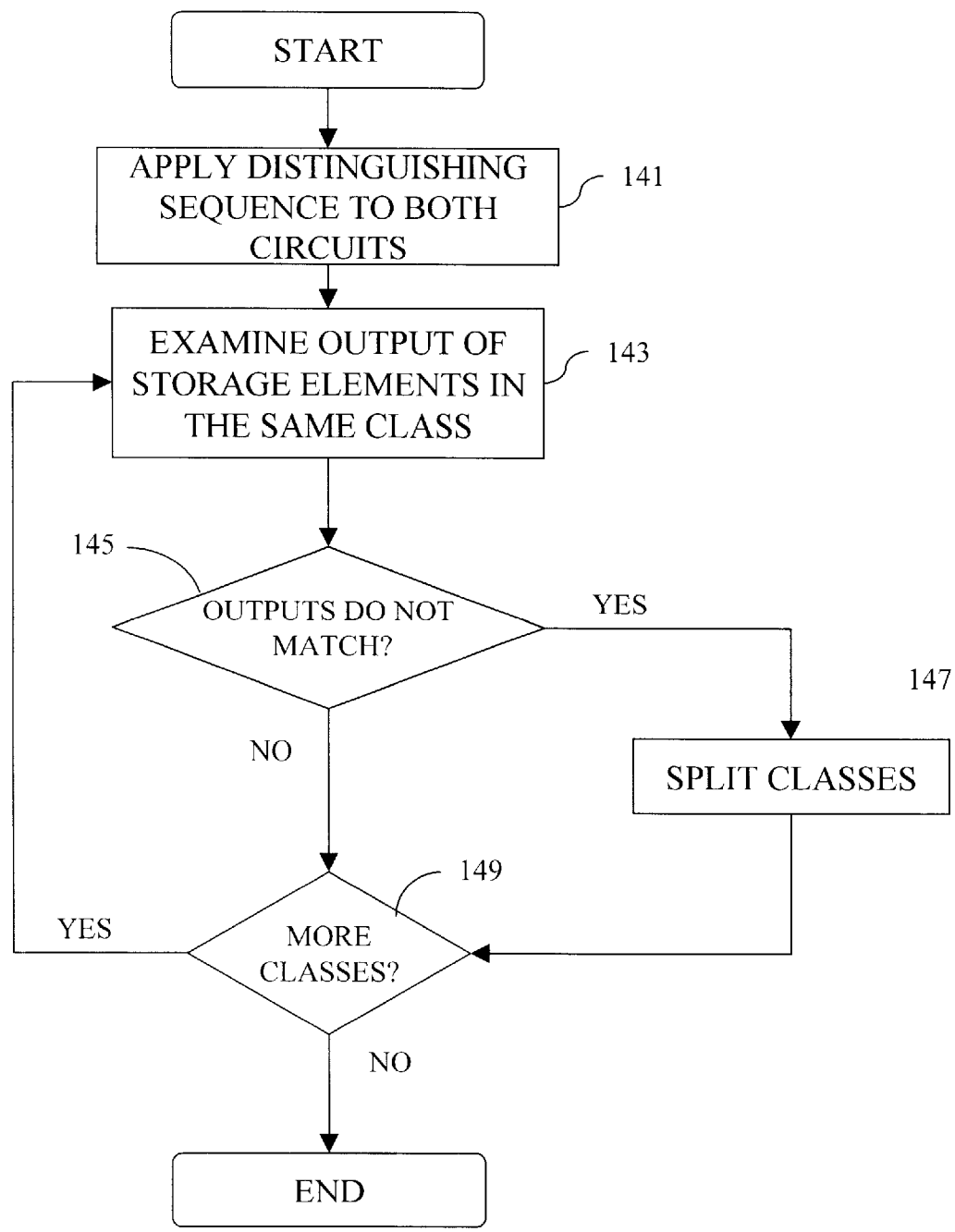
FIG. 4 illustrates a flow diagram of the detailed steps of step 17 of FIG. 1.

FIG. 4 illustrates a flow diagram of the detailed steps of step 17 in FIG. 1. In step 141, the process simulates both circuits by applying the distinguishing sequence of test vectors. In step 143, the process examines the outputs of the storage elements of a class. A class of storage elements is a grouping of storage elements that have yet to be distinguished. Initially, prior to any simulation of the circuit all of the storage elements are placed in one class. In step 145, the process determines if the outputs of the storage elements of the same class are equal. If the values of the outputs are not equal, then, in step 147, the process splits the classes into a set of new clusters.

For example, for a class of storage elements ($S_1$, $S_2$, $S_3$, $S_4$) whose output values are 0,1,1,0 respectively, the class of storage elements is split into two classes. $S_1$, $S_4$ are in one class and $S_2$, $S_3$ are in another class. If, in step 145, the process determines that the output values of a class of the storage elements are the same, then the process determines if other classes of storage elements are available, in step 149. If additional classes of storage elements are present, then the process repeats step 143 and 145. However, if the process determines, in step 149, that no other classes of storage elements are present to be examined, then the process ends.

If the state justification based method identifies that a number of storage elements in the same circuit are indistinguishable, this indicates that the circuit contains redundancies. To handle these indistinguishable storage elements, the state justification based method can be enhanced by providing the method with an initial set of assumptions. An example of an initial assumption is a precomputation of the circuit state space such as identifying storage elements which cannot be distinguished by using a conventional ATPG tool. Another example of an initial assumption is determining implicit computations of storage elements that are considered to be indistinguishable.

If the state justification based method cannot distinguish a number of storage elements, the method largely simplifies the complex problem of verifying sequential circuits by minimizing the total number of storage elements that need to be handled in the resulting sequential circuits. Thus, the sequential circuit is greatly simplified, and conventional sequential verification techniques are able to be applied.

III. Sampling Based Storage Correspondence Method

A sampling based method analyzes portions of two sequential circuits to distinguish groups of storage elements of the two sequential circuits. A portion of a first sequential circuit including one or more storage elements is sampled in one embodiment by assigning constant values to the primary inputs of the circuit. Similarly, a portion of a second sequential circuit including one or more storage elements is sampled in one embodiment by assigning constant values to the primary inputs of the circuit. The sampled portion of the first sequential circuit is compared to the sampled portion of the second sequential circuit for equivalency. If the sampled portion of the first sequential circuit is not equivalent to the sampled portion of the second sequential circuit, then the first sequential circuit contains an error. Conversely, if the sampled portion of the first sequential circuit is equivalent to the sampled portion of the second sequential circuit, then other portions of the first and second sequential circuits are sampled and compared. The sampling and comparing of the sequential circuits, until an error is found or all portions containing storage elements of both sequential circuits are completely sampled and compared.

In one embodiment, the sampling based method uses hash codes to analyze portions of two circuits and thereby distinguish groups of the storage elements. A hash code is an integer representation (computed using arithmetic transformations and semi-numeric decision diagrams) of a boolean function. When a hash code of a sample of boolean function is computed then the hash code is an integer representation of that subspace of the given boolean function. The use of hash codes to represent portions of a Boolean subspace are discussed in J. Jain et al., Probabilistic Verification of {B}oolean Functions, Formal Methods in System Design, vol. 1, 1992 and in J. Jain, *On Analysis of Boolean Functions*, Ph.D Dissertation, Dept. of Electrical and Computer Engineering, University of Texas at Austin, 1993, the disclosures of which are herein incorporated by reference. Identical representation of a portion of a Boolean space have identical hash codes. Hence, a hash code representing a portion of a first Boolean subspace that equals a hash code representing a portion of a second Boolean subspace, then the portions of the first and second Boolean subspaces are also equivalent.

In another embodiment, the sampling based method uses a series of decision diagrams to analyze portions of two circuits and thereby distinguish groups of the storage elements. One example of a decision diagram is a sampled-based BDD. In one embodiment, the BDDs used are partial BDDs that represent portions of a Boolean subspace. Partial BDDS are discussed in D. E. Ross, *Functional calculations using Ordered Partial Multi-Decision Diagrams*, Ph.D Dissertation, Dept. of Electrical and Computer Engineering, University of Texas at Austin, 1990, the disclosure of which is herein incorporated by reference. In another embodiment, the BDDs used are partitioned BDDs which are discussed in J. Jain et al., *Decomposition Techniques for Efficient ROBDD Construction*, LNCS, Formal Methods in CAD 96, Springer-Verlag, November, 1996, the disclosure of which is herein incorporated by reference. In another embodiment, the BDDs used are abstract BDDs which are discussed in S. Jha et al., *Equivalence Checking Using Abstract BDDs*, Proceedings of IEEE International Conference on Computer Design: VLSI in Computers & Processors (1997), the disclosure of which is herein incorporated by reference. Abstract BDDs are BDDs representing a window, or partition of the Boolean space for a function. Accordingly, an abstract BDD inherently incorporates sampling of a circuit. Therefore, double sampling of a circuit occurs using the sampling based method, however, this does not produce any performance problems.

Figure 5:
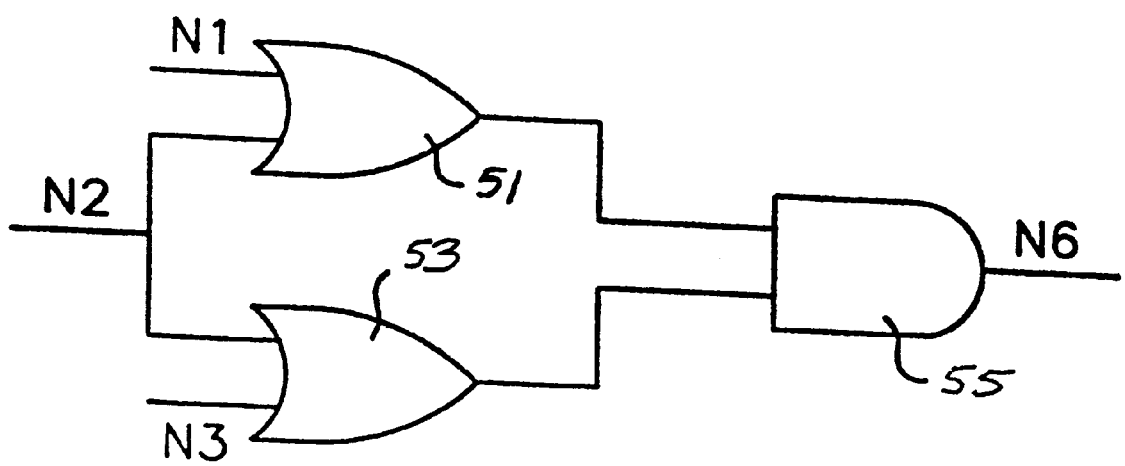
FIG. 5 illustrates a logic design schematic illustrating the topology of a digital circuit.
Figure 6:
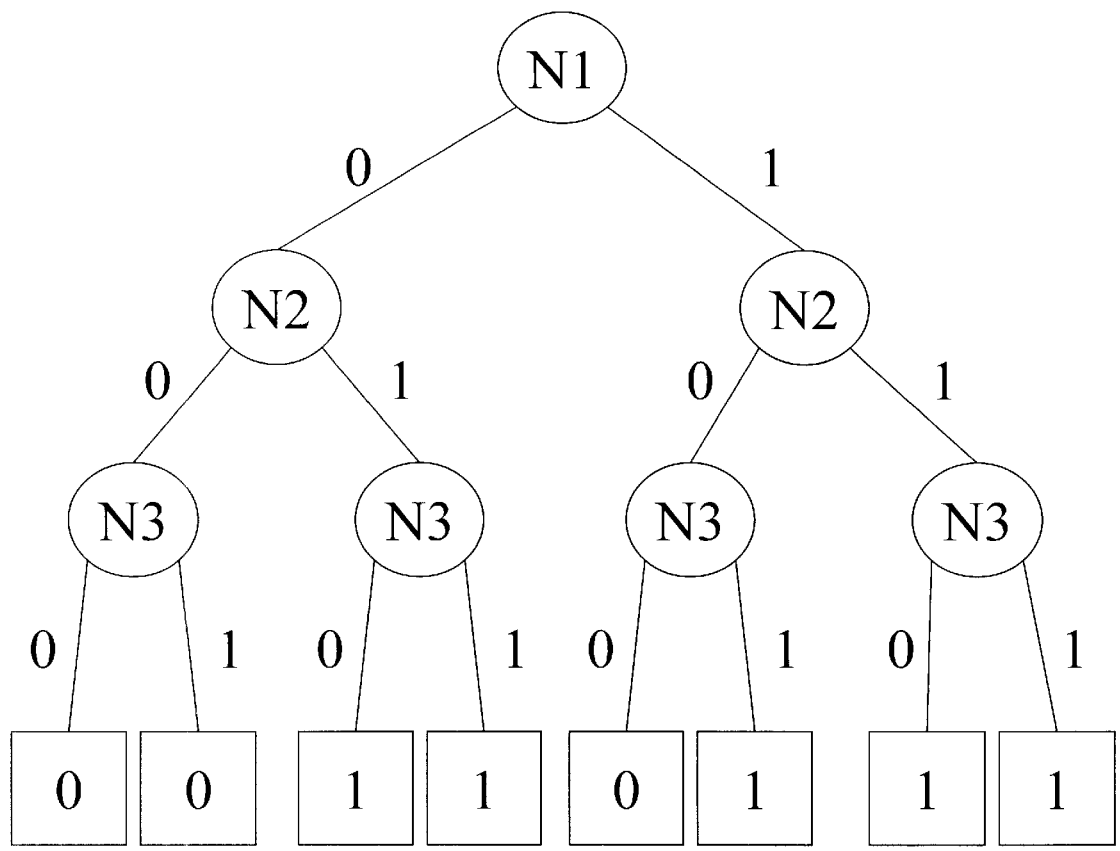
FIG. 6 illustrates a Binary Decision Diagram capturing the functionality of the circuit of FIG. 5.
Figure 7:
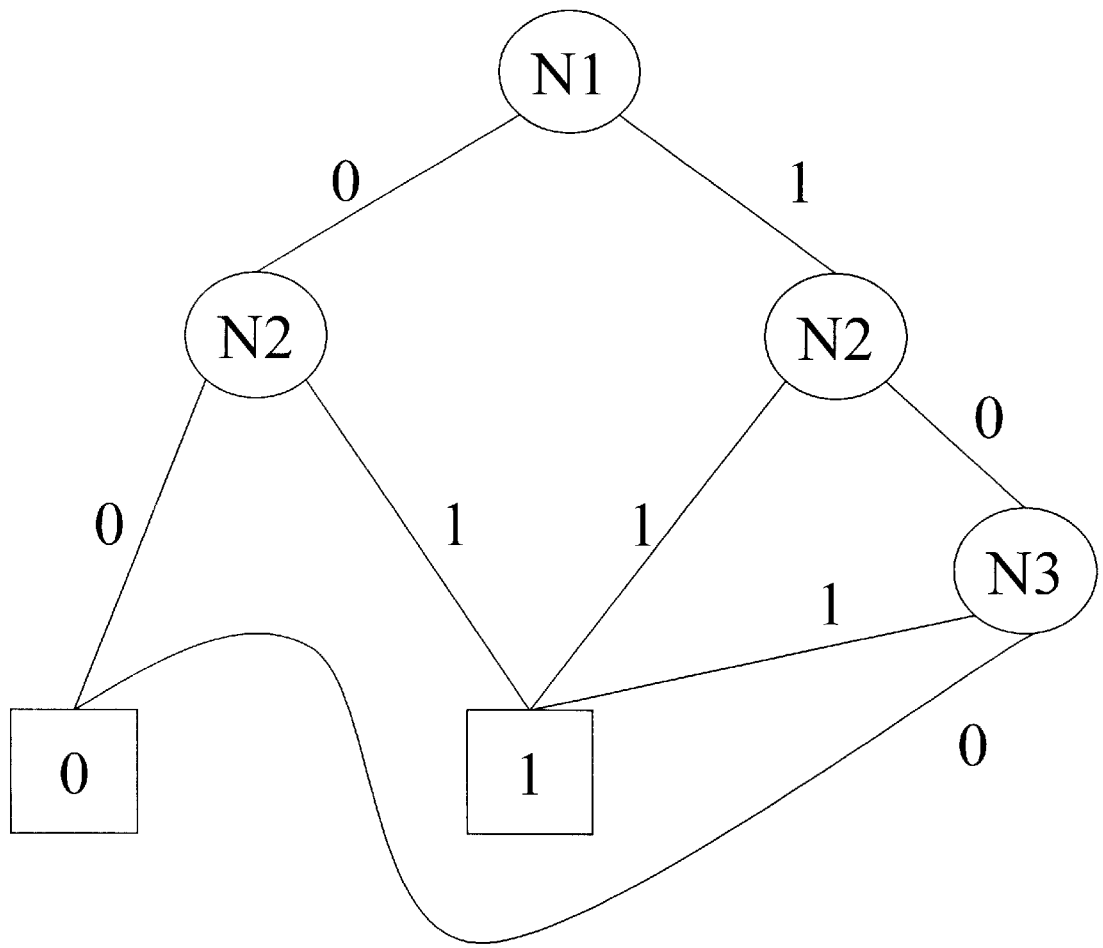
FIG. 7 illustrates a reduced ordered BDD of the BDD of FIG. 6.

BDDs represent Boolean functions. For example, FIG. 5 shows a circuit comprising first and second OR gates 51, 53 and an AND gate 55. The first OR gate has inputs Ni and N2. The second OR gate has inputs N2 and N3 with input N2 being shared by the two OR gates. The outputs of the OR gates are fed into the AND gate. The AND gate has an output N6. Thus, the output of the AND gate can be represented by the Boolean function N6=(N1 or N2) and (N2 or N3). A BBD for the example circuit is shown in FIG. 6. The BDD is composed of nodes which may also be called vertices and branches. Nodes from which no further branches extend are termed terminal nodes or terminals. The BDD is an Ordered BDD (OBDD) as each input is restricted to appearing only once in every path of the BDD and on any path the variable appears in a fixed order. The BDD may be Reduced OBDD (ROBDD) as shown in FIG. 7. The rules for reducing OBDDs are known in the art. The importance of ROBDDs is that the ROBDD for a given function is unique, i.e., canonical for a given order of its support variables. Thus, if two OBDDs reduce to the same ROBDD, the function of the circuits represented by the OBDDs are equivalent.

Generally, ROBDDs are constructed using some variant of the Apply procedure described in R. E. Bryant, Graph Based Algorithms for Boolean Function Manipulation, IEEE Trans. Computer C-35(8):667–691, August 1986, the disclosure of which is herein incorporated by reference. Using the Apply procedure, the ROBDD for a gate G is synthesized by the symbolic manipulation of the ROBDDs of gate G's input. Given a circuit, the gates of the circuit are processed in a depth-first search manner until the ROBDDs of the desired output gates are constructed.

Figure 8:
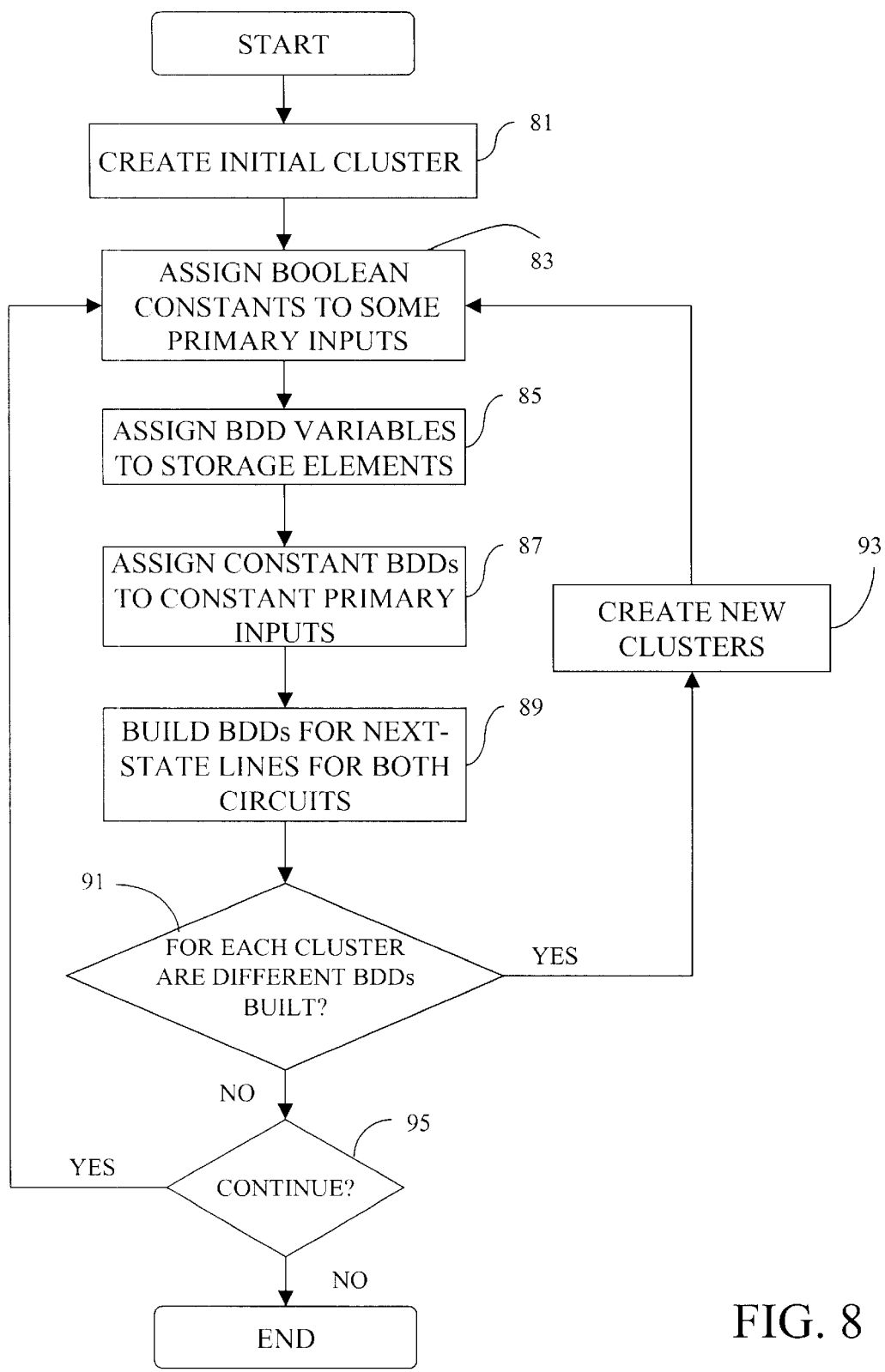
FIG. 8 illustrates a flow diagram of an overview of the sampling based process.

FIG. 8 illustrates a flow diagram of the sampling based method. In step 81, the process creates a single group or an initial cluster of storage elements of a first and second circuits. Therefore, all the storage elements of the first and second circuits are identified and placed in a single cluster. In step 83, the process assigns a set of Boolean constants to a portion of the primary inputs to the circuits. In another embodiment, variables are assigned instead of Boolean constants to some of the primary inputs and a Boolean function is generated for assigned subspace or window using the assigned Boolean variables. An example of window and windows functions are discussed in U.S. patent application Ser. No. 08/964,904, the disclosure of which is herein incorporated by reference. In step 85, the process assigns BDD variables to all of the storage elements. Each storage element within the same cluster is assigned the same BDD variable. Other storage elements in other clusters are assigned different unique BDD variables. In step 87, all of the constant primary inputs are assigned appropriate constant BDDs.

In step 89, BDDs are built for both circuits for the next state lines of the storage elements. The BDDs built are based on the primary inputs and the present state lines. For example, a present state line of a storage element SE, is assigned a BDD variable such as A. Similarly, the primary inputs are assigned BDD variables $X_1$–$X_n$, and the present state lines of the other storage elements are assigned BDD variables $B_1$–$B_n$. All present state lines of the storage elements that are in the same cluster are assigned identical BDD variables. Accordingly, the BDD for the next state line of the storage element SE, is a BDD that represents the Boolean function in terms of A, $X_1$–$X_n$, and $B_1$–$B_n$. In another embodiment, identifiers of the storage elements are computed, determined and compared. An identifier is a next state function in multiple subspaces of a whole boolean space.

In step 91, the process examines the built BDDs to determine if storage elements in the same cluster have different built BDDs. If the process determines that two storage elements in the same cluster have different built BDDS, then, in step 93, the process places the storage elements in different clusters.

For example, a cluster of storage elements ($S_1$, $S_2$, $S_3$) have built BDDs $B_1$, $B_2$ and $B_3$, respectively, built for their next state lines. If $B_1=B_3$ and $B_2 \neq B_1$ then storage element $S_2$ is distinguishable from storage elements $S_1$ and $S_3$. Accordingly, the cluster is divided into two new clusters such that the storage elements $S_1$ and $S_3$ are placed in one cluster and storage element $S_2$ is placed in another. If, in step 91, the process determines that none of the BDDs built for the storage elements in the same cluster differ, then the process continues. In step 95, the process determines if more BDDs are to be built to distinguish other storage elements based on a predetermined criteria. One such predetermined criteria is that no new clusters are created in two successive iterations of the process. If the process determines, in step 95, to continue, then the process repeats steps 83, 85, 87 and 89.

The sampling based method is further enhanced by incorporating a structural processing method. The structural processing method determines transitive fanin cones and transitive fanout cones of the storage elements. The transitive fanin cones of the storage elements represent all the gates from the primary inputs of the circuit to the inputs of the storage elements. The transitive fanout cones of the storage elements represent all the gates from the output of the storage elements to the primary outputs of the circuit. Storage elements which do not share transitive fanin cones and transitive fanout cones are distinguishable. Thus, structural processing allows for a preliminary creation of a set of clusters. Once structural processing is completed and a set of clusters are determined, these clusters are considered to be the initial clusters created in step 81 of the process illustrated in FIG. 8.

Similar to the state justification based method, if the sampling based method is not enhanced and the sampling method identifies a number of storage elements are indistinguishable, the sampling based method largely simplifies the complex problem of verifying a sequential circuit. All storage elements that have been corresponded are treated as primary inputs. Thus, the resultant sequential verification problem is greatly simplified.

IV. Combined State Justification and Sampling Based Method

A combined state justification based and sampling based method combines the strengths of the previously mentioned methods. First, the sampling based method is used to create clusters of storage elements until no new clusters can be created. Second, for clusters containing more than two storage elements, the state justification based method is used to refine the clusters to distinguish the storage elements. Therefore, the correspondence between storage elements of the sequential circuits is determined and the sequential circuit is verified.

Figure 9:
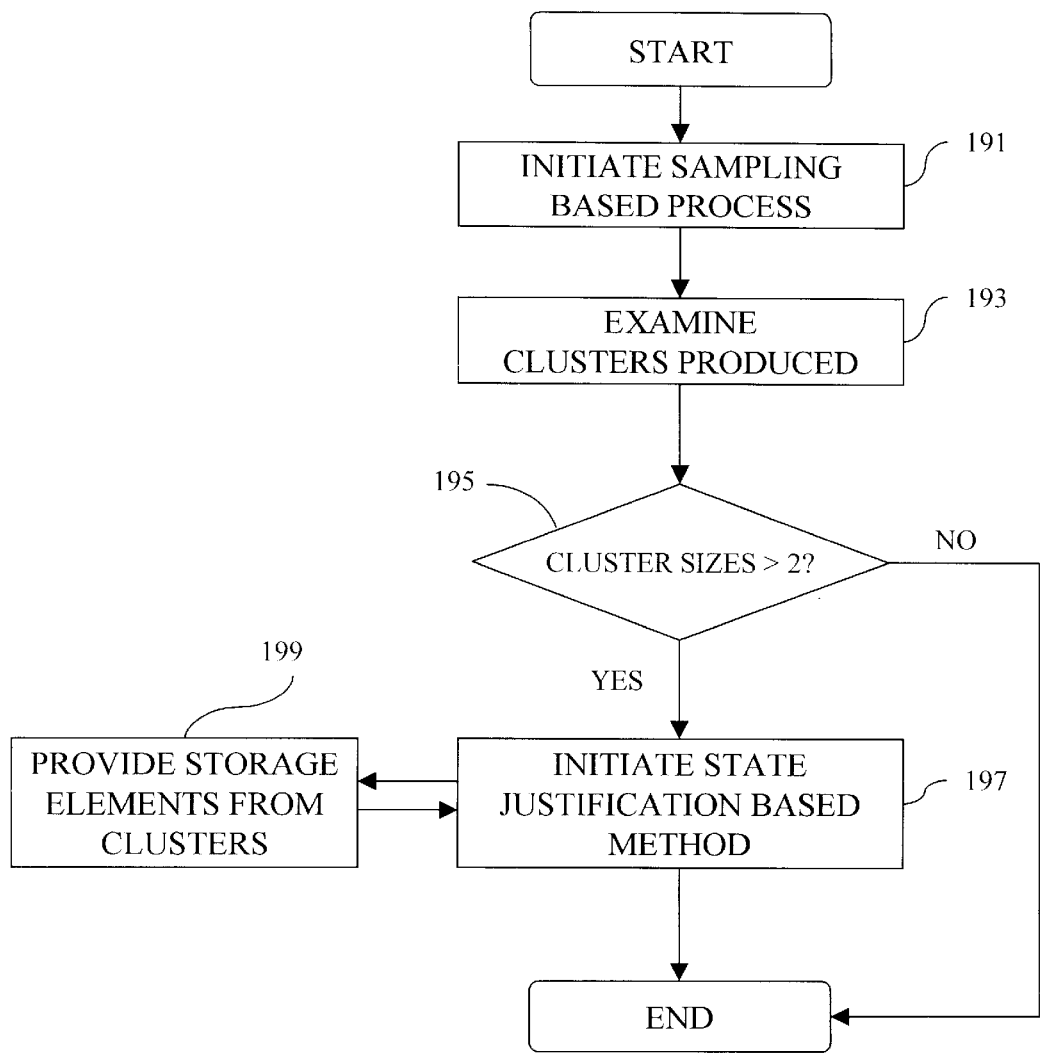
FIG. 9 illustrates a flow diagram of an overview of the combined sampling and state-justification based methods.

FIG. 9 illustrates a flow diagram of an overview of the combined state justification and sampling based method. In step 191, the process initiates the sampling based method previously described and illustrated in FIG. 8. In step 193, the process examines the clusters created by the sampling based method. In step 195, the process determines if one of the clusters contains more than two storage elements. If the process determines that one of the cluster contains more than two storage elements, the process, in step 197, initiates the previously described state justification based method. However, in step 11 of FIG. 1, the pair of storage elements selected is selected from the clusters containing more than one storage element. Hence, in step 199, the process provides to the state justification based method initiated in step 197, the storage elements from clusters, created by the sampling based method, that contain more than two storage elements. Once the state justification based method completes, the process ends. In one embodiment, a filtering-based combinational verification technique, as discussed R. Mukherjee et al., *Filtering Oriented Combinational Verification Approach*, 1997 ACM/IEEE International Workshop on Logic Synthesis, 1997, the disclosure of which is herein incorporated by reference, is used. The filtering-based combinational verification technique is able to verify the functional equivalence of storage elements within a cluster having two or more possible pairs of storage elements. If the process, in step 195, determines that each cluster contains two storage elements, one from each circuit, all the storage elements are considered to be verified and the process ends. If the process, in step 195, determines that only one storage element is left in any cluster, then an error is automatically detected in the circuit. In one embodiment, the error is located by examining the input cone of the one storage element left in the circuit.

In another embodiment, if a cluster has more than a pair of storage elements, a bisimulation relation to find matching state variables is used. In trying to find bisimulation relations between state variables of two sequential circuits, a set of states in which two given state machines representing the two sequential circuits are indistinguishable for any sequence of test vectors of a variable length "I" are found. The length "I" in one embodiment is statically chosen as a small integer, or in another embodiment, the length "I" is chosen dynamically while taking into account the amount of BDD resources being consumed in computing the fixed point during bisimulation relation calculations, as discussed in J. Moondanos et al., *Sequential Redundancy Identification Using Verification Techniques*, International Test Conference, 1992, 197–205, the disclosure of which is herein incorporated by reference. Once some states in the two machines are determined to be equivalent, then by implication, two assignments on state variables which correspond to each other are also known. Hence, these two state assignments for the two machines are equivalent, at least, for any input sequence of length "I". Thus, these assignments provides further correlation between the state variables of the two machines. For example, suppose two cluster are found. One cluster contains storage elements a1, a2, and a3 and another cluster contains storage elements b1, b2, and b3. Since, the equivalent states are a1=0, a2=1, and a3=1, and b1=0, b2=1, b3=1, then storage elements a1 and b1 are grouped together into a new cluster.

V. Verification Using Correspondence

By using the state justification, sampling or the combined state justification and sampling based methods, the storage elements from a first sequential circuit are grouped with the storage elements from a second sequential circuit. In other words, once the storage elements from the circuits have been distinguished, each group created contains some storage elements from the first sequential circuit and some storage elements from the second sequential circuit. If a group contains exactly one storage element from each circuit, then these two storage elements are considered to be functionally equivalent. By establishing the correspondence or groupings of the storage elements, the storage elements based on their equivalence relationships are disregarded as a potential source for errors. Therefore, the remaining portions of the first sequential circuit, which may include the storage elements that are indistinguishable or the combinational logic that remains to be verified. However, without having to further verify the distinguished storage elements, the verification of the remaining portions of the circuit becomes a simpler problem. In fact, using efficient conventional combinational verification techniques, the remaining portions of the first sequential circuit is verified.

Figure 10:
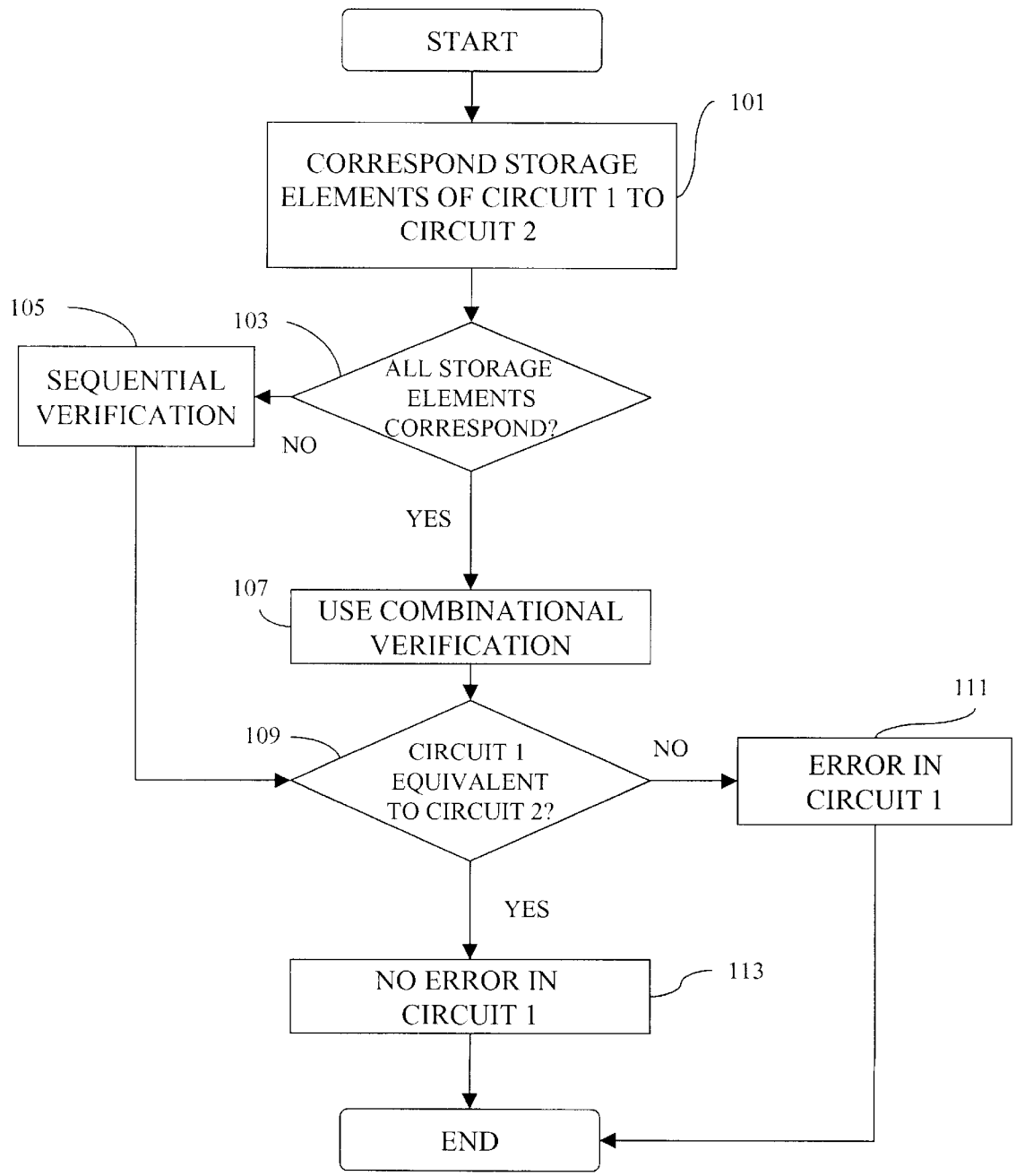
FIG. 10 illustrates a flow diagram of an overview of verification of a circuit using correspondence.

FIG. 10 illustrates an operational overview of the verification process using the methods previously described. In step 101, the process selects and initiates the state-justification based method, the sampling based method or the combined state and sampling method to correspond the storage elements of the first sequential circuit to the second sequential circuit. In step 103, once the method initiated in step 101 has completed, the process determines if the correspondence between all of the storage elements of both circuits has been established. If the process determines that some of the storage elements were indistinguishable, in step 103, then the process initiates sequential verification techniques in step 105. In step 109, once the sequential verification techniques initiated in step 105 has completed, the process determines if the sequential circuits are equivalent. If the process determines that the circuits are not equivalent, an error is detected in the first sequential circuit (step 111). If the process determines that the circuits are equivalent, no error is detected in the first sequential circuit (step 113) and the first sequential circuit is verified as being error free.

If the process determines that all of the storage elements were corresponded, the two circuits are simplified to combinational circuits. The process initiates combinational verification techniques to verify the simplified circuits in step 107. In step 109, once the combinational verification technique initiated in step 107 has completed, the process determines if the sequential circuits are equivalent. If the process determines that the circuits are not equivalent, an error is detected in the first sequential circuit (step 111). If the process determines that the circuits are equivalent, no error is detected in the first sequential circuit (step 113) and the first sequential circuit is verified as being error free.

Accordingly, the present invention provides a system and methodology for determining the correspondence between the storage elements of two sequential circuits. Once the correspondence between the storage elements of the sequential circuits are determined, the equivalence of the circuits is tested using a combinational verification tool (if complete correspondence is found) or using a sequential verification tool (if complete correspondence is not found) and thereby the circuit is verified. Although this invention has been described in certain specific embodiments, many additional modifications and variations would be apparent to those skilled in the art. It is therefore to be understood that this invention may be practiced otherwise than as specifically described. Thus the present embodiments of the invention should be considered in all respects illustrative and not restrictive. The scope of the invention to be indicated by the appended claims and their equivalence rather than the foregoing description.

What is claimed is:

1. A method of verifying two sequential circuits, a first sequential circuit and a second sequential circuit, the method comprising:

determining storage elements of the first sequential circuit;

determining storage elements of the second sequential circuit;

selecting pairs of storage elements of the first sequential circuit;

establishing distinguishing criteria from the selected pairs of storage elements of the first sequential circuit;

grouping the storage elements of the first and second sequential circuits based on the distinguishing criteria; and wherein the distinguishing criteria further comprises computing a sequence of test vectors that causes outputs of one storage element in a selected pair of storage elements to differ from outputs of another storage element in the pair of storage elements and the computing a sequence of test vectors comprises adding a test circuit to the first sequential circuit, the test circuit being capable of testing for a predetermined fault, and adding a test generator that generates and applies test vectors to the primary inputs to the first sequential circuit to test for the predetermined fault.

2. The method of claim 1 wherein grouping the storage elements of the first and second sequential circuits further comprises:

simulating the first and second sequential circuits using the computed sequence of test vectors; and matching the outputs of the storage elements of the first sequential circuit to the outputs of the storage elements of the second sequential circuit.

3. The method of claim 2 further comprising continuing to select and group storage elements of the first and second sequential circuits based on established distinguishing criteria until all pairs of storage elements are selected.

4. The method of claim 3 wherein the storage elements are flip-flops, latches, registers, and other similar storage devices.

5. The method of claim 1 further comprising computing initial states of the storage elements of the first sequential circuit.

6. The method of claim 1 further comprising implicitly computing indistinguishable relationships between the storage elements of the first sequential circuit.

7. The method of claim 1 wherein adding a test circuit comprises modifying the first sequential circuit to include an XOR gate, the XOR gate having inputs connected to the outputs of the selected pair of storage elements.

8. The method of claim 1 wherein the predetermined fault is a stuck-at-0 fault.

9. A method of verifying two sequential circuits, a first sequential circuit and a second sequential circuit, the method comprising:

determining storage elements of the first and second sequential circuits;

selecting pairs of storage elements of the first sequential circuit;

applying an automatic test pattern generator to the first sequential circuit such that the automatic test pattern generator computes a sequence of test vectors that distinguishes a selected pair of storage elements; and grouping the storage elements of the first and second sequential circuits based on the computed sequence of test vectors.

10. The method of claim 9 wherein a sequence of test vectors that distinguishes a selected pair of storage elements is a sequence of test vectors that causes outputs of one storage element in a selected pair of storage elements to differ from outputs of another storage element in the pair of storage elements.

11. The method of claim 10 further comprising continuing to select and group storage elements of the first and second sequential circuits based on continuing to apply the automatic test pattern generator to compute sequences of test vectors until all pairs of storage elements are selected.

12. The method of claim 11 wherein the storage elements are flip-flops, latches, registers, and other similar storage devices.

13. A method of verifying two sequential circuits, a first sequential circuit and a second sequential circuit both having primary inputs and primary outputs, the method comprising:
  grouping storage elements of the first and second sequential circuits into at least one cluster;
  determining present states of the storage elements of the first and second sequential circuits;
  determining next states of the storage elements of the first and second sequential circuits;
  comparing the next states of the storage elements of the first sequential circuit to the next states of the corresponding storage elements of the second sequential circuit; and
  re-grouping the storage elements of the first and second sequential circuits into new clusters based on the equivalence of the next states of the first and second sequential circuits.

14. A method of verifying two sequential circuits, a first sequential circuit and a second sequential circuit both having primary inputs and primary outputs, the method comprising:
  grouping storage elements of the first and second sequential circuits into at least one cluster;
  determining present states of the storage elements of the first and second sequential circuits;
  determining next states of the storage elements of the first and second sequential circuits;
  comparing the next states of the storage elements of the first sequential circuit to the next states of the corresponding storage elements of the second sequential circuit;
  re-grouping the storage elements of the first and second sequential circuits into new clusters based on the equivalence of the next states of the first and second sequential circuits;
  assigning constant values to at least one of the primary inputs of the first sequential circuit;
  assigning constant values to at least one of the primary inputs of the second sequential circuit that correspond to the at least one of the primary inputs of the first sequential circuit;
  assigning identical variables to the storage elements of the first and second sequential circuits that are in the same cluster; and
  computing the next states of the storage elements of the first and second sequential circuits from the assigned constant values and variables.

15. The method of claim 14 further comprising continuing to determine and compare present and next states of the storage elements of the first and second sequential circuits until no new clusters of storage elements are possible.

16. The method of claim 15 wherein determining the next states of the storage elements comprises building decision diagrams to represent the next states of the storage elements.

17. The method of claim 16 wherein the decision diagrams built are sampling-based BDDs.

18. The method of claim 17 wherein comparing the next states of the storage elements comprises comparing the built sampling-based BDDs of the next states of the storage elements of the first sequential circuit with the built sampling-based BDD of the next states of the storage elements of the second sequential circuit.

19. The method of claim 18 wherein the storage elements are flip-flops, latches, registers, and other similar storage devices.

20. The method of claim 18 further comprising grouping the first and second sequential circuits based on structural aspects.

21. The method-of claim 20 wherein grouping the first and second sequential circuits comprises:
  determining transitive fanin cones of each storage element; and
  grouping the storage elements having identical primary inputs in the transitive fanin cones.

22. The method of claim 20 wherein grouping the first and second sequential circuits comprises:
  determining transitive fanout cones of each storage element; and
  grouping the storage elements having identical primary outputs in the transitive fanout cones.

23. The method of claim 16 wherein the decision diagrams built are partial BDDs.

24. The method of claim 16 wherein the decision diagrams built are abstract Boolean Decision Diagrams (BDDs).

25. The method of claim 15 further comprising:
  selecting pairs of storage elements from the groupings of storage elements having more than two storage elements;
  determining storage elements of the first sequential circuit;
  determining storage elements of the second sequential circuit;
  establishing distinguishing criteria from the selected pairs of storage elements; and
  re-grouping the storage elements of the first and second sequential circuits based on the distinguishing criteria.

26. The method of claim 25 wherein the distinguishing criteria further comprises computing a sequence of test vectors that causes outputs of one storage element in a selected pair of storage elements to differ from outputs of another storage element in the pair of storage elements.

27. The method of claim 26 wherein grouping the storage elements of the first and second sequential circuits further comprises:
  simulating the first and second sequential circuits using the computed sequence of test vectors; and
  matching the outputs of the storage elements of the first sequential circuit to the outputs of the storage elements of the second sequential circuit.

28. The method of claim 27 further comprising continuing to select and group storage elements of the first and second sequential circuits based on established distinguishing criteria until all pairs of storage elements are selected.

29. The method of claim 28 wherein computing a sequence of test vectors comprises:
  adding a test circuit to the first sequential circuit, the test circuit is capable of testing for a predetermined fault; and
  adding a test generator that applies test vectors to the primary inputs to the first sequential circuit to test for the predetermined fault.

30. The method of claim 29 wherein adding a test circuit comprises modifying the first sequential circuit to include an XOR gate, the XOR gate having inputs connected to the outputs of the selected pair of storage elements.

31. The method of claim 30 wherein the predetermined fault is a stuck-at-0 fault.

32. The method of claim 25 further comprising:
selecting pairs of storage elements from the groupings of storage elements having two or more storage elements;
verifying the functional equivalence of the selected pairs of storage elements by applying a filtering based combinational verification.

33. The method of claim 25 further comprising identifying an error when only one storage element is within any of the groupings of storage elements.

34. The method of claim 33 further comprising locating the error identified by examining the input cone of the only one storage element within the groupings of storage elements.

35. A method of verifying two sequential circuits, a first sequential circuit and a second sequential circuit both having primary inputs and primary outputs, the method comprising:
grouping storage elements of the first and second sequential circuits into at least one cluster;
determining present states of the storage elements of the first and second sequential circuits;
determining next states of the storage elements of the first and second sequential circuits;
comparing the next states of the storage elements of the first sequential circuit to the next states of the corresponding storage elements of the second sequential circuit;
re-grouping the storage elements of the first and second sequential circuits into new clusters based on the equivalence of the next states of the first and second sequential circuits;
assigning functions to some primary inputs of the first sequential circuit;
assigning variables to some of the primary inputs of the first sequential circuit;
assigning functions from the assigned variables for subspaces of the first sequential circuit;
assigning variables to at least one of the primary inputs of the second sequential circuit that correspond to the at least one of the primary inputs of the first sequential circuit;
assigning functions from the assigned variables for subspaces of the second sequential circuit;
assigning identical variables to the storage elements of the first and second sequential circuits that are in the same cluster; and
computing identifiers for the next states of the storage elements of the first and second sequential circuits from the assigned constant values and variables.

36. The method of claim 35 further comprising continuing to determine identifiers and compare the identifiers of the storage elements of the first and second sequential circuits until no new clusters of storage elements are possible.

37. The method of claim 36 wherein the identifiers is the next state function in multiple subspaces of a whole boolean space.

38. The method of claim 37 wherein the decision diagrams built are decision diagrams built in at least one partial boolean space created in a subspace.

39. The method of claim 38 wherein comparing the next states of the storage elements comprises comparing the built subspace BDDs of the next states of the storage elements of the first sequential circuit with the built subspace BDD of the next states of the storage elements of the second sequential circuit.

40. The method of claim 39 wherein the storage elements are flip-flops, latches, registers, and other similar storage devices.

* * * * *

UNITED STATES PATENT AND TRADEMARK OFFICE
CERTIFICATE OF CORRECTION

PATENT NO. : 6,408,424 B1
DATED : June 18, 2002
INVENTOR(S) : Rajarshi Mukherijee et al.

It is certified that error appears in the above-identified patent and that said Letters Patent is hereby corrected as shown below:

Title page,
Item [56], OTHER PUBLICATIONS, "Specificatoins" should be -- Specifications --
Item [57], ABSTRACT,
Lines 9-10, "equivalences" should be -- equivalence --

Column 12,
Line 18, "being capable of" should be -- being used for --

Signed and Sealed this

Eleventh Day of November, 2003

JAMES E. ROGAN
*Director of the United States Patent and Trademark Office*